United States Patent
Wills et al.

(10) Patent No.: US 7,872,486 B2
(45) Date of Patent: Jan. 18, 2011

(54) WING-SHAPED SUPPORT MEMBERS FOR ENHANCING SEMICONDUCTOR PROBES AND METHODS TO FORM THE SAME

(75) Inventors: Kendall Scott Wills, Sugar Land, TX (US); Ronald Norman Parker, Stafford, TX (US)

(73) Assignee: Texas Instruments Incorporated, Dallas, TX (US)

( * ) Notice: Subject to any disclaimer, the term of this patent is extended or adjusted under 35 U.S.C. 154(b) by 110 days.

(21) Appl. No.: 12/202,851

(22) Filed: Sep. 2, 2008

(65) Prior Publication Data

US 2010/0052709 A1   Mar. 4, 2010

(51) Int. Cl.
*G01R 31/02* (2006.01)
(52) U.S. Cl. ........................ 324/761; 324/72.5; 324/149
(58) Field of Classification Search ........................ None
See application file for complete search history.

(56) References Cited

U.S. PATENT DOCUMENTS

| | | | | |
|---|---|---|---|---|
| 4,633,176 A | * | 12/1986 | Reimer | 324/758 |
| 5,969,345 A | | 10/1999 | Williams et al. | |
| 6,294,922 B1 | * | 9/2001 | Okubo et al. | 324/761 |
| 6,392,424 B1 | * | 5/2002 | Wang et al. | 324/754 |
| 6,797,528 B2 | | 9/2004 | Liu et al. | |
| 7,138,812 B2 | * | 11/2006 | Park et al. | 324/754 |
| 2004/0070417 A1 | * | 4/2004 | Isa | 324/762 |
| 2006/0037194 A1 | | 2/2006 | Worledge | |

* cited by examiner

*Primary Examiner*—Paresh Patel
(74) *Attorney, Agent, or Firm*—Yingsheng Tung; Wade J. Brady, III; Frederick J. Telecky, Jr.

(57) ABSTRACT

Example wing-shaped support members for enhancing semiconductor device probes and methods to form the same are disclosed. A disclosed example semiconductor device probe includes a finger having a first end and a second end. The example probe further includes a tip having a base and a pointed end. The base is joined to the first end of the finger and the tip tapers from the base to the pointed end. The probe also includes a support member on the tip to increase a rigidity of the tip.

26 Claims, 4 Drawing Sheets

WING-SHAPED SUPPORT MEMBERS FOR ENHANCING SEMICONDUCTOR PROBES AND METHODS TO FORM THE SAME

FIELD OF THE DISCLOSURE

The present disclosure relates generally to semiconductor device probes and, more particularly, to wing-shaped support members for enhancing semiconductor device probes and methods to form the same.

BACKGROUND

Over time, the features of semiconductor devices (e.g., transistors) have become smaller to, among other things, reduce power consumption, increase speed or increase integration. As feature sizes have decreased, probes used to test semiconductor devices have become correspondingly smaller.

An example probe includes a base and one or more fingers, which extend from the base. The fingers may be made very short to maintain their stiffness, while the base operates as a wide cantilever. The example probe may be formed by depositing a metal layer, patterning or etching the metal layer to form the fingers, and lithographically defining the base to expose the fingers.

Another example probe is a micro-machined silicon pyramid having an ultra-sharp tip and a small Schottky contact area. The example probe is surrounded by an aluminum film having a small opening for the end of the tip.

In yet another example, a semiconductor probe tip is formed by depositing one or more layers of material, and then lithographically shaping one or more of the deposited layers to define the generally conical shape of the probe tip.

In still a further example, a semiconductor device probe has a base, a cylindrical finger extending from the base, and a conical tip portion extending from the cylindrical finger. A support member is attached to the cylindrical finger of the probe rearward of the conical tip to decrease flexure of the finger.

SUMMARY

Example wing-shaped support members for enhancing semiconductor device probes and methods to form the same are disclosed. In examples described herein, a probe having a base, a finger extending from the base, and a tip tapering from the finger to a pointed end is provided with a wing-shaped support member. An example wing-shaped support member is formed on the tip of the probe forward of the finger. An example support member disclosed herein is formed or shaped to increase the rigidity of the tip of the probe. By increasing the rigidity of the tip, a number of advantages are realized. For example, the tip becomes substantially more resistant to deformity when forces are applied to the tip to bring the pointed end of the tip into ohmic, electrical and/or thermal contact with a semiconductor device to be tested. Such resistance to deformity increases, among other things, the useful lifespan of the probe and the speed at which semiconductor devices can be tested. Moreover, the use of such a wing-shaped support member on the tip allows the pointed end of the probe tip to be smaller than prior art probe tips to thereby facilitate the testing of semiconductors constructed using smaller transistor geometries. In keeping with this desire for a reduced pointed end, the example support wing is spaced forward of the finger and tapers back from the pointed end.

The example wing-shaped support members described herein are formed or shaped to not interfere with an automated vision control system used to bring the probe tip into contact with a particular feature of a semiconductor device (e.g., an input of a transistor to be tested). In some examples, in addition to the tip mounted wing-shaped support member described above, a second support member is attached to the finger of the probe to decrease flexure of the finger. Alternatively or additionally, a third support may be located on the base of the probe to decrease flexure of the base, A disclosed example semiconductor device probe includes a base, a finger having a first end joined to the base and a second end, a tip having a base integral to the second end of the finger, the tip tapering from the base to a pointed end, and a support member located on the tip between the base and the pointed end to increase a rigidity of the tip. In some examples, the support member extends onto the finger, does not extend all the way to the pointed end, or both.

A disclosed example method to form wing-shaped support members for enhancing semiconductor device probes includes tapering a semiconductor device probe to form a tip having a base and a pointed end, and forming a support member on the tip between the base and the pointed end to increase a rigidity of the tip.

Figure 1:
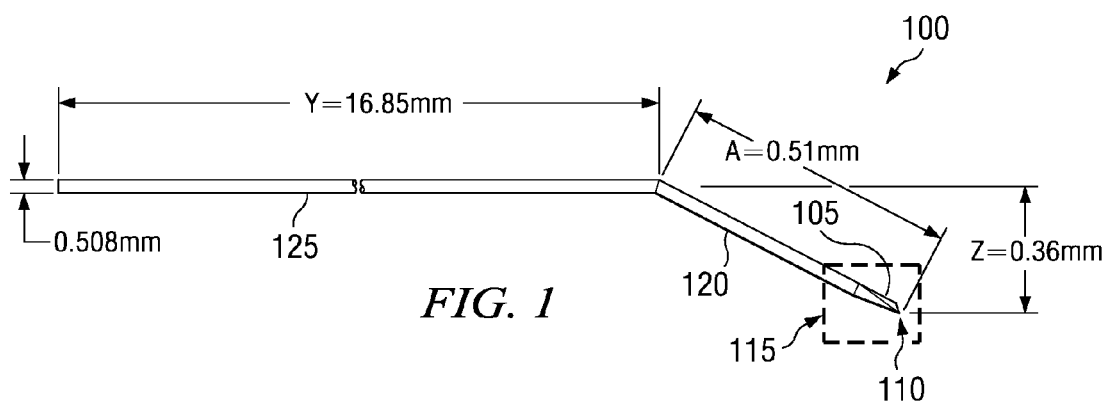
FIG. 1 is an illustration of an example semiconductor device probe having a wing-shaped support member.

Wherever possible, the same reference numbers will be used throughout the drawing(s) and accompanying written description to refer to the same or like parts. As used in this patent, stating that any part (e.g., a portion, a member, etc.) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is integral to another part means that the two parts have been, for example, created, formed, joined, modified, bonded and/or otherwise combined so as to be rendered essentially inseparable.

DETAILED DESCRIPTION

Wing-shaped support members for enhancing semiconductor device probes and methods to form the same are disclosed. Although the example methods and apparatus described herein generally relate to nanoprobes useful to probe semiconductor wafers manufactured using sub-micron features, the disclosure is not limited to such. On the contrary, the teachings of this disclosure may be applied to any type and/or size of probe for interfacing with any number or type(s) of devices (semiconductor, electronics or otherwise).

FIG. 1 illustrates an example semiconductor device probe 100 having a support member 105 constructed in accordance with the teachings of the disclosure. The example wing-shaped support member 105 of FIG. 1 is formed on the tip portion 115; near, but rearward of the pointed end 110 of the example probe 100. In some examples, the support member 105 extends all the way to the pointed end 110 but is tapered to not increase the size of the pointed end 110. The example support member or wing 105 is formed or shaped to increase the rigidity of the tip portion 115 of the probe 100. By increasing the rigidity of the example tip portion 115 of FIG. 1, a number of advantages are realized. For example, the tip portion 115 becomes substantially more resistant to deformities that might otherwise occur in the absence of the support member 105 when forces are applied to the tip portion 115 to bring the pointed end 110 into ohmic, electrical and/or thermal contact with a semiconductor device to be tested (not shown). Such resistance to deformity increases, among other things, the useful lifespan of the example probe 100 and the speed at which semiconductor devices can be tested. In some examples described below, the example wing or support member 105 of FIG. 1 is formed or shaped to not interfere with an automated vision control system (not shown) used to bring the pointed end 110 of the probe into contact with a particular feature of a semiconductor device (e.g., an input of a transistor to be tested).

The example probe 100 of FIG. 1 is a nanoprobe constructed of an electrically conductive material (e.g., a cylindrical copper or aluminum wire with a diameter of 0.508 millimeters (mm)) that allows a testing tool (not shown) coupled to a semiconductor device via the pointed end 110 to test one or more components or circuits of the semiconductor device. The example probe 100 includes the example tip portion 115 with pointed end 110, a finger or forward portion 120 and a base or rearward portion 125. In the illustrated example, the base 125 is cylindrical. The finger 120 of the illustrated example, like the base 125, is cylindrical. The finger 120 has a first end joined to the base 125 and a second end. The example tip 115 has a base 210 (FIG. 2) joined to the second end of the finger 120. The tip 115 tapers from its base 210 adjacent the second end of the finger 120 to the pointed end 110.

In the example of FIG. 1, the base 125 is shown in a generally horizontal plane and the finger 120 is angled relative to the base 125. During use, the example probe 100 of FIG. 1 is typically positioned with the base 125 parallel to the surface of a semiconductor device to be tested (e.g., in parallel planes). The example base 125 of FIG. 1 is 16.85 millimeters (mm) in length and 0.508 mm in diameter. The example finger 120 of FIG. 1 is 0.51 (mm) in length, 0.508 mm in diameter, and is bent at an angle (e.g., 45 degrees) relative to the base 125 to permit an automated vision control system or a test-device operator to perceive (e.g., "see") the pointed end 110 and, thus, be able to position the end 110 in precise contact with a particular feature of the semiconductor device. In general, bending the forward finger 120 between an angle of 110 degrees and 160 degrees relative to the base 125 enables the pointed end 110 to be perceived by an automated vision control system or a test-device operator. In some examples, a second support (not shown) is attached to the base 125 or to the finger 120 in addition to the example support member or wing 105 of FIG. 1 to further decrease flexure of the probe.

Figure 2A:
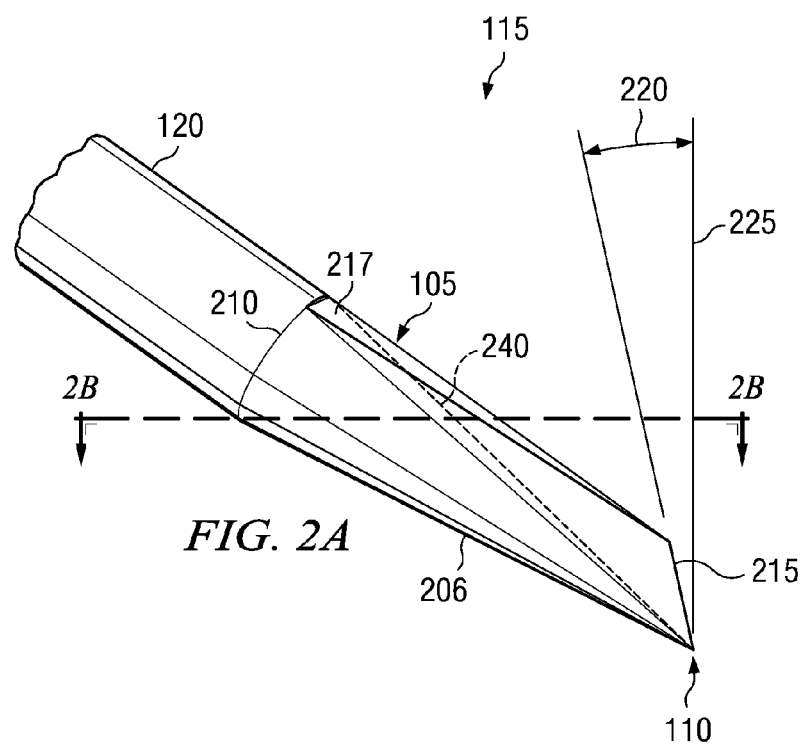
FIG. 2A is a side view of a tip portion of the example probe of FIG. 1.

FIG. 2A is a side view of the example probe tip 115 of FIG. 1. The example probe tip 115 of FIG. 2A includes a tapered portion 206 that runs from the base 210 of the tip 115 to the pointed end 110. The base 210 of the example tapered portion 206 of FIG. 2A is integral with the second end of the finger 120 and tapers to the pointed end 110. In the illustrated example of FIG. 2A, the tapered portion 206 has a generally conical shape having a central axis that is aligned with the longitudinal axis of the finger 120. However, the tapered portion 206 may take any form (e.g., a curved form) and be disposed at any angle relative to the finger 120. The example tapered portion 206 may be formed using, for example, an electrochemical shaping process. The example pointed end 110 of FIG. 2A preferably has a diameter of less than 0.1 micrometer (µm).

To stiffen the probe tip 115, the example probe tip 115 of FIG. 2A includes the example support member or wing 105. The example support member 105 of FIG. 2A is formed (as described below in connection with FIG. 3) on the example tapered portion 206 of the tip 115 between the base 210 and the pointed end 110 of the tip 115. In some examples, the support member 105 is formed to become integral with the tapered portion 206. The example support member 105 of FIG. 2A extends along the entire length of the tapered portion 206. However, the support member 105 could extend beyond the tapered portion 206 onto the finger 120 (or beyond) as shown in FIG. 2D, not extend all the way to the finger 120, or not extend all the way to the pointed end 110. The example support member 105 increases the rigidity of the tapered portion 206 thereby substantially reducing or preventing the tapered portion 206 from deforming when a downward force is applied to bring the pointed end 110 in ohmic, thermal and/or electrical contact with a semiconductor device to be tested.

The example support member 105 of FIG. 2A is formed to have a center edge 215 disposed at an angle 220 relative to a line 225 that is perpendicular to the surface of a semiconductor device to be tested or, equivalently, perpendicular to the axis of the base 125 of FIG. 1. The example angle 220 of FIG. 2A is between 6 and 30 degrees to permit an automated vision control system to perceive and precisely position the pointed end 110 relative to a semiconductor device to be tested. In some examples, another edge 217 of the example support member 105 is parallel with the longitudinal axis of the finger 120. However, the edge 217 may be disposed at any angle (e.g., 30 degrees, 45 degrees, 90 degrees, etc.) relative to the longitudinal axis of the finger 120.

Figure 2B:
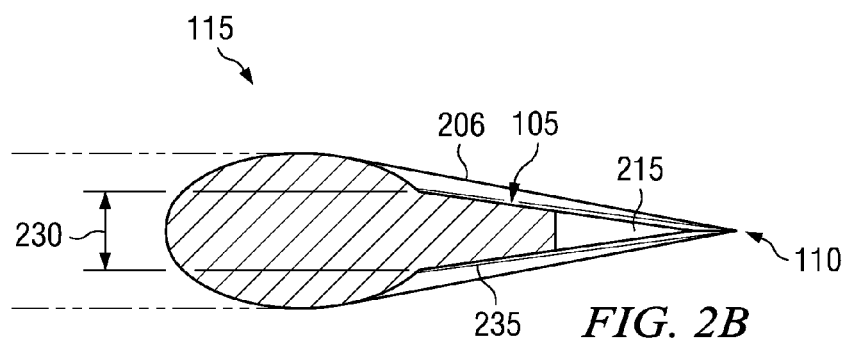
FIG. 2B is a top cross-sectional view of the tip portion of FIG. 2A.
Figure 2C:
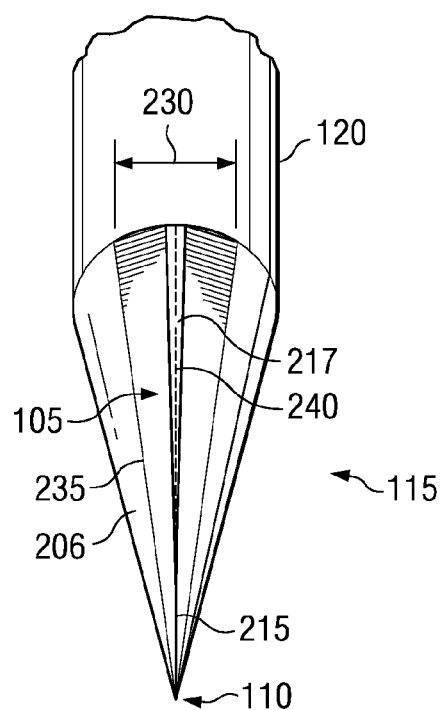
FIG. 2C is a front view of the example tip portion of the example probe of FIG. 1.
Figure 2D:
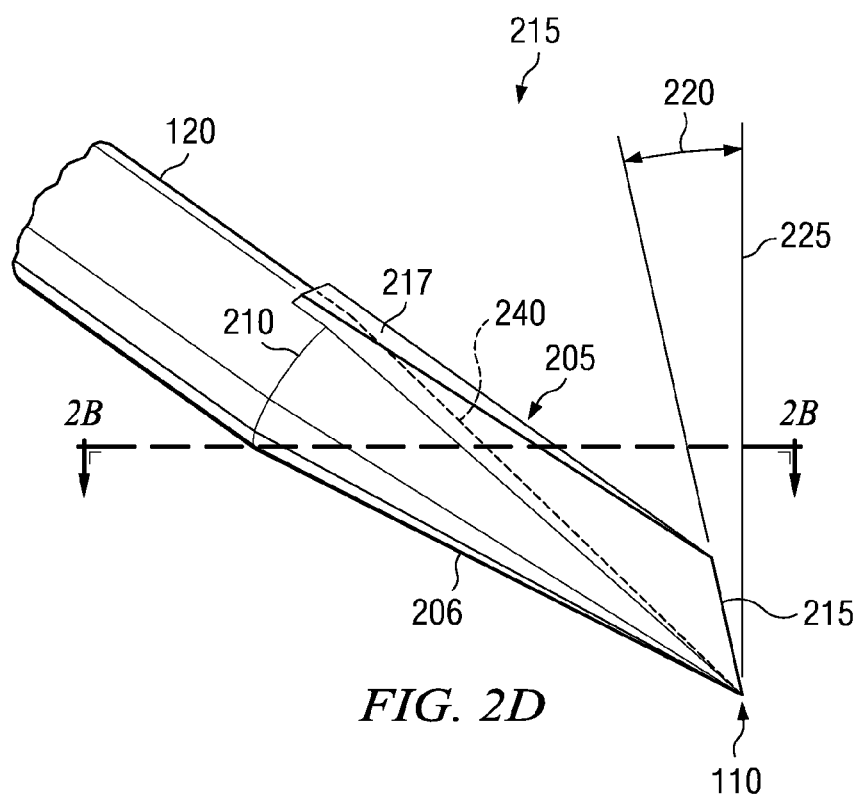
FIG. 2D is a side view of another example tip portion for the example probe of FIG. 1.

FIG. 2B is a top cross-sectional view of the example probe tip 115 taken along line 2B-2B of FIG. 2A. FIG. 2C is a front view of the example probe tip 115 of FIG. 1. As shown in FIGS. 2B and 2C, the example support member 105 is tapered along its length on both sides from the center edge 215 to the tapered portion 206. The thickness of the edge 215 is less than a thickness 230 of a base 235 of the support member 105. The increased thickness 230 of the base 235 increases the surface area of the support member 105 that is in contact with the tip 115, thereby increasing the rigidity of the tip 115. The width of the edge 215 tapers from the base 210 of the tapered portion 206 to the pointed end 110. As shown in FIGS. 2A-2C, the example support member 105 extends around the conical tapered portion 206 on either side of a top ridge or edge 240 (see FIG. 2A) of the conical portion 206.

FIG. 2D is a side view of another example probe tip 215 for the example probe 100 of FIG. 1. In comparison to the example probe tip portion 115 of FIG. 2A, the example support member 205 of FIG. 2D extends beyond the tapered portion 206 onto the finger 120. Because the example support member 205 of FIG. 2D extends onto the finger 120, it stiffens the finger 120 in addition to stiffening the tapered portion 206.

Figure 3:
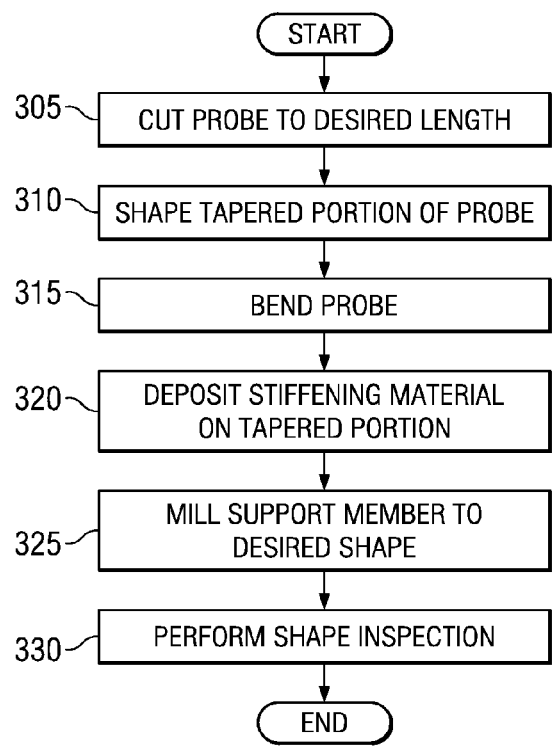
FIG. 3 is a flowchart of an example process that may be carried out to form the example semiconductor device probe of FIG. 1.

FIG. 3 is a flowchart of an example manufacturing process that may be carried out to form the example nanoprobe 100 of FIG. 1. The example process of FIG. 3 may be carried out by one or more pieces of manufacturing equipment, one or more processors, one or more controllers or any other suitable processing devices. For example, the example process of FIG. 3 may be embodied in coded instructions stored on a tangible medium such as a flash memory, a read-only memory (ROM) and/or random-access memory (RAM) associated with a processor. Alternatively, some or all of the example process of FIG. 3 may be implemented using any combination(s) of hardware or firmware or software. Also, some or all of the example process of FIG. 3 may be implemented manually or as any combination of any of the foregoing techniques, for example, any combination of firmware, or software, or discrete logic or hardware. Further, many other methods of implementing the example process of FIG. 3 may be employed. For example, the order of execution of the blocks may be changed, or one or more of the blocks described may be changed, eliminated, sub-divided, or combined.

The example process of FIG. 3 begins with cutting the example probe 100 to a desired length (e.g., 17.36 mm) (block 305). The tapered portion 206 of the probe 100 is formed using, for example, an electrochemical sharpening process (block 310). The diameter of the pointed end 110 after electrochemical sharpening is approximately 0.5 μm. The probe 100 is then bent (e.g., at 45 degrees) to form the finger or forward portion 120 and the base or rearward portion 125 (block 315).

Material is then deposited on the tapered portion 206 to form the support member 105 (block 320). Material may be depositing using any number or type(s) of tools, processes, materials, chemicals or energy sources. For example, a laser, an electron beam, an ion beam, a focused ion beam, or any combination thereof can be used to dissociate a reactant chemical to deposit the material. The energy source (e.g., a focused ion beam with a 50 picoAmp (pA) current) is controlled to impinge on the tapered portion 206. A gas present in the vicinity of the energized tapered portion 206 will dissociate to thereby deposit material. A typical gas that may be employed in the process is a metal organic gas such as tungsten mW) hexa carbonyl gas, but other types of gases may be used. In some examples, a gas having a platinum (Pt) cursor is used. The deposition of material continues until the desired amount of material is deposited. In the case of a focused ion beam, the ion beam can be used to rough up the surface of the tapered portion 206 before material is deposited to increase the adhesion between the deposited material and the tapered portion 206. If the energy source is focused and can raster in any desired pattern, the material can be deposited in the shape described above in connection with FIGS. 2A-2C.

The support member 105, the tapered portion 206 or both are then milled to their desired final shape (block 325). If the material deposited in block 320 is mass deposited, then the support member 105 is milled using, for example, focused ion beam milling. The final shape of the pointed end 110 is then formed or milled using, for example, focused ion beam milling. In some example, the underside of the tapered portion 206 is milled first because the beam taper of the focused ion beam mill may dull the pointed end 110 if the underside is milled last.

The shape of the probe 100 is inspected using, for example, an electron beam (block 330). For example, the pointed end 110 can be checked to make sure it has a diameter of less than 0.1 μm and that the angle 220 (FIG. 2A) is at least 6 degrees.

Figure 4:
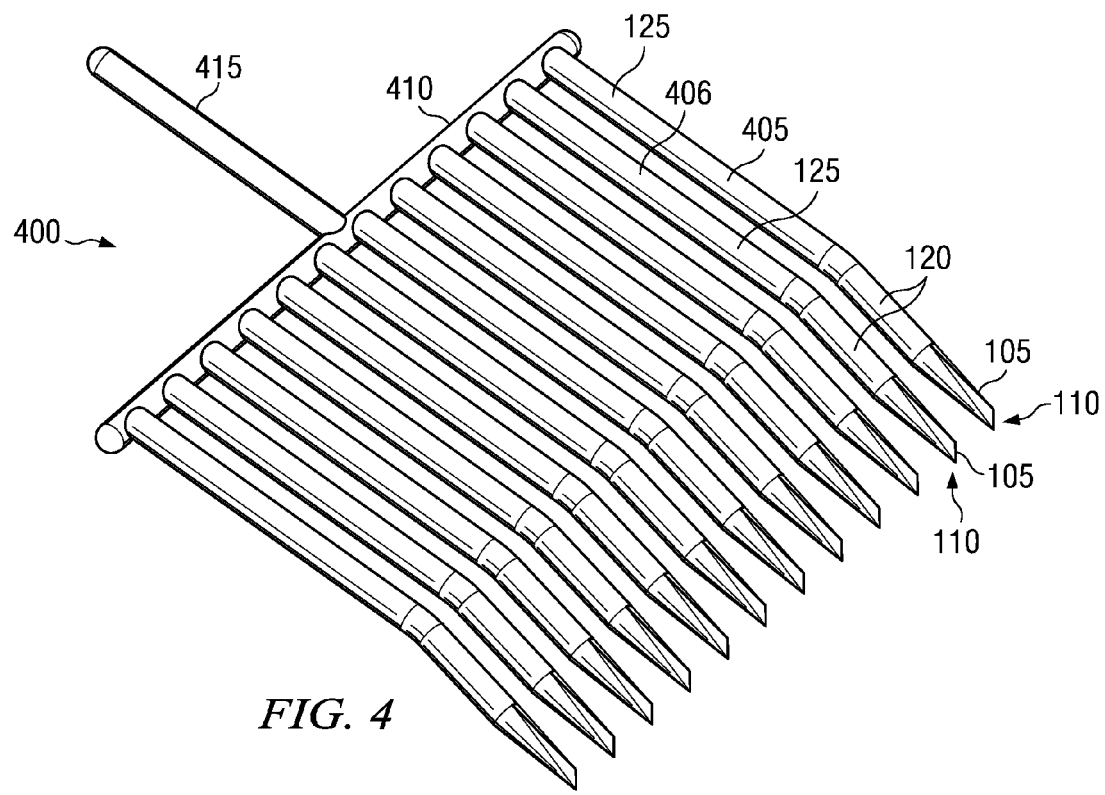
FIG. 4 is an illustration of an example semiconductor test device including multiple probes each having a wing-shaped support member.

FIG. 4 illustrates an example semiconductor device test device 400 having a plurality of semiconductor device probes, two of which are designated at reference numerals 405 and 406. The example device probes 405 and 406 of FIG. 4 are substantially similar to the example probe 100 described above in connection with FIGS. 1, and 2A-2D. The example semiconductor device probes 405 and 406 are affixed, bonded and/or otherwise attached to an arm 410. The example arm 410 of FIG. 1 is affixed, bonded and/or otherwise attached to a main body 415, which may be used to mechanically couple the example test device 400 of FIG. 4 to test equipment and/or to position the semiconductor device probes 405 and 406 relative to a semiconductor device to be tested. While the example probes 405 and 406 of FIG. 4 are parallel to each other, they may be disposed at other angles with respect to each other. Moreover, while the example arm 410, the example main body 415, and rearward portions 125 (FIG. 1) of the probes 405 and 406 of FIG. 4 are in substantially the same plane, they need not be in the same plane. Further still, the bases 125 of the example probes 405 and 406 may be omitted with fingers 120 of the probes 405 and 406 attached directly to the arm 410 and disposed at an angle relative to the longitudinal axis of the main body 415 to facilitate contact of the pointed ends 110 of the probes 405 and 406 with a semiconductor device to be tested.

Figure 5A:
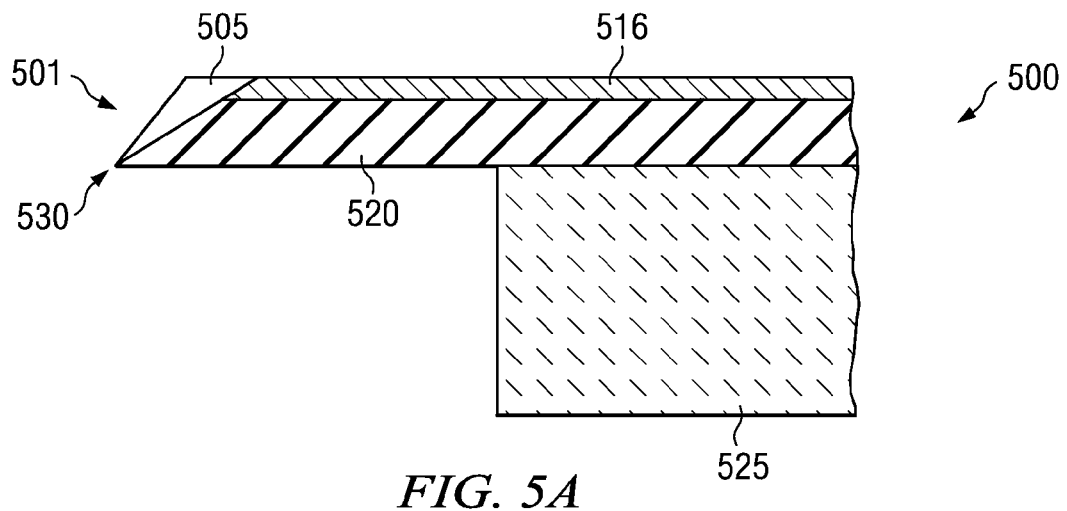
FIGS. 5A and 5B are side and top views, respectively, of another example semiconductor test probe including multiple fingers each having a tip with a respective wing-shaped support member.
Figure 5B:
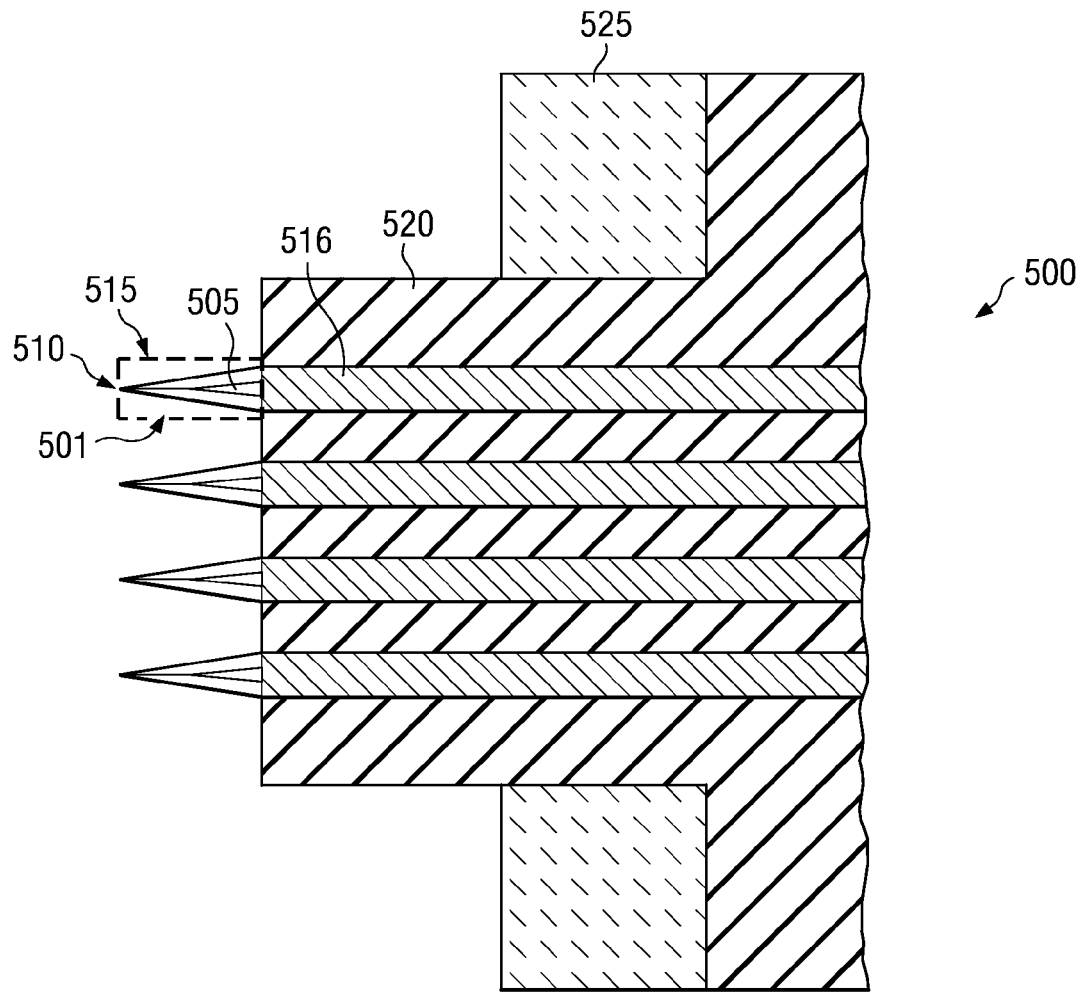

FIGS. 5A and 5B illustrate another example semiconductor test device 500 including a plurality of semiconductor device probes (one of which is designated at reference numeral 501). Each of the test probes 501 has a support member (one of which is designated at reference numeral 505). FIG. 5A illustrates a side view of the example test device 500, and FIG. 5B illustrates a top view of the example test device 500.

The example semiconductor device probe 501 of FIGS. 5A-5B is patterned in a conductive layer 516, which is layered on top of a dielectric layer 520 and a substrate 525. The example dielectric layer 520 electrically isolates the example probes 501 from each other. The example layers 516, 520 and 525 may be formed and/or patterned via any number and/or type(s) of semiconductor manufacturing processes. An example manner of constructing the layers 516, 520 and 525 is described in U.S. Publication No. 2006/0037194, entitled "Multipoint Nanoprobe and Method for Fabrication," published on Feb. 23, 2006, and which is hereby incorporated by reference in its entirety.

After the example layers 516, 520 and 525 are formed, the example probes 501 of FIGS. 5A and 5B are tapered at one end to form a pointed end 510 that may be brought into ohmic, electrical and/or thermal contact with a semiconductor device to be tested. The example probe 501 is tapered to have a generally triangular shape that is aligned with the longitudinal axis of the probe 501. However, the probe 501 may be shaped in accordance with any form (e.g., a curved or conical form). The probe 501 may be tapered using, for example, a focused-ion beam and/or an electrochemical shaping process.

To stiffen the example tips 515 of the probes 501, the example probes 501 of FIGS. 5A and 5B include the example support member or wing 505. The example support members 505 of FIGS. 5A and 5B are formed on the example tapered portion of their respective probes 501 using a process similar to the example process described above in connection with FIG. 3. The example support members 505 of FIGS. 5A and 5B extend along the entire length of the tapered portion of their corresponding probes 501. However, the support members 505 could extend beyond their respective tapered portions and onto their respective untapered portion(s) of their respective probes 501, not extend the entire length of the tapered portion of their respective probes, or not extend all the way to the pointed end 510 of their respective probes. The example support member 505 increases the rigidity of the tip 515, thereby substantially reducing or preventing the tip 515 from deforming when a downward force is applied to bring the pointed end 510 into ohmic, thermal or electrical contact with a semiconductor device to be tested.

Although certain methods, systems, and articles of manufacture have been described herein, the scope of coverage of this patent is not limited thereto. To the contrary, this patent covers all methods, systems, and articles of manufacture fairly falling within the scope of the appended claims either literally or under the doctrine of equivalents.

What is claimed is:

1. A semiconductor device probe comprising:
   a finger having a first end and a second end;
   a tip having a base and a pointed end, the base being joined to the first end of the finger, the tip tapering from the base to the pointed end;
   a support member located on the tip between the base and the pointed end to increase a rigidity of the tip
   a second finger having a third end and a fourth end;
   a second tip having a second pointed end and a second base, the second base being joined to the third end of the second finger, the second tip tapering from the second base to the second pointed end; and
   a second support member on the second tip to increase a rigidity of the second tip; and an arm attached to the second end of the first finger and to the forth end of the second finger.

2. The probe as defined in claim 1, further comprising a rearward portion having a forward end integral to the second end of the finger, the rearward portion being positioned at an angle relative to the finger.

3. The probe as defined in claim 2, wherein the support member comprises a center edge disposed at an angle relative to a line perpendicular to a longitudinal axis of the rearward portion to permit visibility of the pointed end.

4. The probe as defined in claim 1, wherein the support member extends from the pointed end past the base of the tip.

5. The probe as defined in claim 1, wherein the support member does not extend to the pointed end.

6. The probe as defined in claim 1, wherein the support member has a shape to allow the pointed end to be visible when testing a semiconductor device.

7. The probe as defined in claim 1, wherein the support member is to prevent the tip form deforming.

8. The probe as defined in the claim 1, wherein the support member extends on both sides of a tip ridge of the tip.

9. The probe as defined in claim 8, wherein the support member is tapered to increase a surface area in contact with the tip.

10. The probe as defined in claim 1, wherein the support member has a support member base having a width, the width being less than a diameter of the base the tip.

11. The probe as defined in claim 1, further comprising a second support located on at least one of the finger or a rearward portion.

12. The probe as defined in claim 1, wherein the support member has a triangular cross-section.

13. The probe as defined in claim 1, wherein the support member is winged shaped.

14. A semiconductor device probe, comprising:
    a finger having a first end and a second end;
    a tip having a base and a pointed end, the base being joined to the first end of the finger, the tip tapering from the base to the pointed end; and
    a support member located on the tip between the base and the pointed end to increase a rigidity of the tip;
    wherein the finger is patterned in a conductive layer, which is layered above a dielectric layer and a substrate, and further comprising a second finger electrically isolated from the first finger by the dielectric layer, the second finger having a second tip extending therefrom, a second support member being located on the second tip.

15. The probe as defined in claim 14, further comprising a rearward portion having a forward end integral to the second end of the finger, the rearward portion being positioned at an angle relative to the finger.

16. The probe as defined in claim 15, wherein the support member comprises a center edge disposed at an angle relative to a line perpendicular to a longitudinal axis of the rearward portion to permit visibility of the pointed end.

17. The probe as defined in claim 14, wherein the support member extends from the pointed end past the base of the tip.

18. The probe as defined in claim 14, wherein the support member does not extend to the pointed end.

19. The probe as defined in claim 14, wherein the support member has a shape to allow the pointed end to be visible when testing a semiconductor device.

20. The probe as defined in claim 14, wherein the support member is to prevent the tip form deforming.

21. The probe as defined in the claim 14, wherein the support member extends on both sides of a tip ridge of the tip.

22. The probe as defined in claim 21, wherein the support member is tapered to increase a surface area in contact with the tip.

23. The probe as defined in claim 14, wherein the support member has a support member base having a width, the width being less than a diameter of the base the tip.

24. The probe as defined in claim 14, further comprising a second support located on at least one of the finger or a rearward portion.

25. The probe as defined in claim 14, wherein the support member has a triangular cross-section.

26. The probe as defined in claim 14, wherein the support member is winged shaped.

* * * * *